(12) United States Patent
Forbes

(10) Patent No.: US 6,864,139 B2
(45) Date of Patent: Mar. 8, 2005

(54) STATIC NVRAM WITH ULTRA THIN TUNNEL OXIDES

(75) Inventor: Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 3 days.

(21) Appl. No.: 10/786,726

(22) Filed: Feb. 25, 2004

(65) Prior Publication Data

US 2004/0166621 A1 Aug. 26, 2004

Related U.S. Application Data

(62) Division of application No. 09/945,398, filed on Aug. 30, 2001, now Pat. No. 6,730,960, which is a division of application No. 09/515,630, filed on Feb. 29, 2000, now Pat. No. 6,639,835.

(51) Int. Cl.[7] .................................. H01L 21/336
(52) U.S. Cl. ........................ 438/275; 257/321
(58) Field of Search .................. 438/275, 263, 438/264; 257/321

(56) References Cited

U.S. PATENT DOCUMENTS

| | | | |
|---|---|---|---|
| 3,387,286 A | 6/1968 | Dennard | 340/173 |
| 3,882,469 A | 5/1975 | Gosney, Jr. | 340/173 R |
| 4,051,354 A | 9/1977 | Choate | 235/312 |
| 4,173,766 A | 11/1979 | Hayes | 357/23 |
| 4,313,106 A | 1/1982 | Hsu | 340/825.91 |
| 4,409,723 A | 10/1983 | Harari | 29/571 |
| 4,435,785 A | 3/1984 | Chapman | 365/147 |
| 4,471,240 A | 9/1984 | Novosel | 307/463 |
| 5,020,030 A | 5/1991 | Huber | 365/185 |

(List continued on next page.)

OTHER PUBLICATIONS

"Frequently–Asked Questions (FAQ) About Programmable Logic", http://www.OptiMagic.com/faq.html, (1997), 15 pages.

Chen, J., et al., "Hot Electron Gate Current and Degradation in P–Channel SOI MOSFET's", *1991 IEEE International SOI Conference Proceedings*, Vail Valley, Colorado, (Oct. 1991), pp. 8–9.

Dipert, Brian, "Flash Memory Goes Mainstream", *IEEE Spectrum*, 30(10), (Oct. 1993), 48–52.

Frank, J., et al., "Monte Carlo Simulations of p– and n–Channel Dual–Gate Si MOSFET's at the Limits of Scaling", *IEEE Transactions on Electron Devices*, 40(11), (Nov. 1993), p. 2103.

(List continued on next page.)

*Primary Examiner*—David Nelms
*Assistant Examiner*—Quoc Hoang
(74) *Attorney, Agent, or Firm*—Schwegman, Lundberg, Woessner & Kluth, P.A.

(57) ABSTRACT

Structures and methods involving non volatile depletion mode p-channel memory cells with an ultrathin tunnel oxide thicknesses, e.g. less than 50 Angstrom (Å), have been provided. Write and erase operations are performed by tunneling. The floating gate of the depletion mode p-channel memory cell is adapted to hold a fixed charge over a limited range of floating gate potentials or electron energies. There is a range potentials applied to the floating gate for which there are no final nor initial states in the silicon substrate or p+ source region. In this range of potentials there can be no charge leakage from the floating gate by tunneling or thermally assisted tunneling. The charge state of the floating gate will modulate the conductivity of the underlying transistor channel, with different stable and non-volatile charge states resulting in different conductivity states. Other aspects are also included.

31 Claims, 10 Drawing Sheets

U.S. PATENT DOCUMENTS

| | | | |
|---|---|---|---|
| 5,105,388 A | 4/1992 | Itano et al. | 365/189.08 |
| 5,327,380 A | 7/1994 | Kersh, III et al. | 365/195 |
| 5,406,524 A | 4/1995 | Kawamura et al. | 365/226 |
| 5,408,115 A | 4/1995 | Chang | 257/324 |
| 5,455,791 A | 10/1995 | Zaleski et al. | 365/185.26 |
| 5,464,785 A | 11/1995 | Hong | 437/43 |
| 5,530,581 A | 6/1996 | Cogan | 359/265 |
| 5,555,206 A | 9/1996 | Uchida | 365/149 |
| 5,559,449 A | 9/1996 | Padoan et al. | 326/40 |
| 5,579,259 A | 11/1996 | Samachisa et al. | 365/185.14 |
| 5,598,214 A | 1/1997 | Endo | 257/324 |
| 5,608,670 A | 3/1997 | Akaogi et al. | 365/185.23 |
| 5,646,428 A | 7/1997 | Hamada | 257/239 |
| 5,671,178 A | 9/1997 | Park et al. | 365/185.22 |
| 5,706,227 A | 1/1998 | Chang et al. | 365/185.18 |
| 5,740,104 A | 4/1998 | Forbes | 365/185.03 |
| 5,754,477 A | 5/1998 | Forbes | 365/185.33 |
| 5,768,193 A | 6/1998 | Lee et al. | 365/185.25 |
| 5,790,455 A | 8/1998 | Caywood | 365/185.96 |
| 5,796,670 A | 8/1998 | Liu | 365/228 |
| 5,801,401 A | 9/1998 | Forbes | 257/77 |
| 5,811,865 A | 9/1998 | Hodges et al. | 257/411 |
| 5,831,304 A * | 11/1998 | Hara | 257/316 |
| 5,852,306 A | 12/1998 | Forbes | 257/315 |
| 5,852,311 A | 12/1998 | Kwon et al. | |
| 5,869,370 A | 2/1999 | Chuang et al. | 438/264 |
| 5,886,368 A | 3/1999 | Forbes et al. | 257/77 |
| 5,936,274 A | 8/1999 | Forbes et al. | 257/315 |
| 5,959,896 A | 9/1999 | Forbes | 365/185.33 |
| 5,973,356 A | 10/1999 | Noble et al. | 257/319 |
| 5,989,958 A | 11/1999 | Forbes | 438/257 |
| 5,991,225 A | 11/1999 | Forbes et al. | 365/230.06 |
| 6,008,091 A | 12/1999 | Gregor et al. | 438/261 |
| 6,011,725 A | 1/2000 | Eitan | 365/185.33 |
| 6,025,627 A | 2/2000 | Forbes et al. | 257/327 |
| 6,031,263 A | 2/2000 | Forbes et al. | 257/315 |
| 6,049,477 A | 4/2000 | Taira | 365/145 |
| 6,063,668 A | 5/2000 | He et al. | 438/264 |
| 6,096,640 A | 8/2000 | Hu | 438/652 |
| 6,100,559 A | 8/2000 | Park | 257/315 |
| 6,124,729 A | 9/2000 | Noble et al. | 326/41 |
| 6,137,725 A | 10/2000 | Caser et al. | 365/185.23 |
| 6,204,179 B1 | 3/2001 | McTeer | 438/687 |
| 6,207,222 B1 | 3/2001 | Chen et al. | 427/97 |
| 6,222,224 B1 | 4/2001 | Shigyo | 257/315 |
| 6,245,613 B1 | 6/2001 | Hsu et al. | |
| 6,246,089 B1 | 6/2001 | Lin et al. | 257/315 |
| 6,265,266 B1 | 7/2001 | Dejenfelt et al. | 438/258 |
| 6,278,155 B1 | 8/2001 | Okabe et al. | 257/328 |
| 6,297,103 B1 | 10/2001 | Ahn et al. | 438/275 |
| 6,316,316 B1 | 11/2001 | Wu | 438/260 |
| 6,319,774 B1 | 11/2001 | Hai | 438/259 |
| 6,331,724 B1 * | 12/2001 | Chen et al. | 257/365 |
| 6,383,939 B1 | 5/2002 | Yang et al. | 438/706 |
| 6,384,448 B1 | 5/2002 | Forbes | 257/315 |
| 6,456,535 B2 | 9/2002 | Forbes et al. | 365/185.28 |
| 6,515,328 B1 | 2/2003 | Yang et al. | 257/315 |
| 6,583,011 B1 | 6/2003 | Xia et al. | 438/275 |
| 6,605,961 B1 | 8/2003 | Forbes | 326/41 |
| 6,639,835 B2 | 10/2003 | Forbes | 365/186.14 |
| 6,720,221 B1 | 4/2004 | Ahn et al. | 438/275 |
| 6,730,960 B2 | 5/2004 | Forbes | 257/321 |
| 2001/0011744 A1 | 8/2001 | Sung | 257/314 |
| 2002/0016081 A1 | 2/2002 | Aloni et al. | 438/714 |
| 2002/0020871 A1 | 2/2002 | Forbes | 257/315 |
| 2002/0064911 A1 | 5/2002 | Eitan | 438/216 |
| 2002/0113262 A1 | 8/2002 | Forbes | 257/315 |
| 2003/0001197 A1 | 1/2003 | Chang et al. | 257/315 |
| 2003/0201491 A1 | 10/2003 | Chung | 257/324 |

OTHER PUBLICATIONS

Ghodsi, Ramin, et al., "Gate–Induced Drain–Leakage in Buried–Channel PMOS–A Limiting Factor in Development of Low–Cost, High–Performance 3.3–V, 0.25–um Technology", *IEEE Electron Device Letters*, 19(9), (Sep. 1998), 354–356.

Hodges, D. A., et al., *Analysis and Design of Digital Integrated Circuits*, McGraw–Hill Book Company, 2nd Edition, (1988), 394–396.

Moore, Will R., "A Review of Fault–Tolerant Techniques for the Enhancement of Integrated Ccircuit Yield", *Proceedings of the IEEE*, 74(5), (May 1986), 684–698.

Muller, D. A., "The Electronic Structure at the Atomic Scale of Ultrathin Gate Oxides", *Nature*, 399, (Jun. 1999), 758–761.

Ohguro, T., et al., "10th Micron P–MOSFET's with Ultra Thin Epitaxial Channel Layer Grown by Ultra–High Vacuum CVD", *IEDM*, Washington, D.C., (1993), pp. 433–436.

Ohnakado, T., et al., "1.5V Operation Sector–Erasable Flash Memory with Bipolar Transistor Selected (BITS) P–Channel Cells", *1998 Symposium on VLSI Technology; Digest of Technical Papers*, (1998), 14–15.

Ohnakado, T., et al., "Novel Electron Injection Method Using Band–to–Band Tunneling Induced Hot Electron (BBHE) for Flash Memory with a P–Channel Cell", *1995 International Electron Devices Meeting Technical Digest*, Washington, D.C., (1995), pp. 279–282.

Ohnakado, T., et al., "Novel Self–Limiting Program Scheme Utilized N–Channel Select Transistors in P–Channel DINOR Flash Memory", *1996 International Electron Devices Meeting Technical Digest*, San Francisco, CA, (1996), pp. 181–184.

Papadas, C., "Modeling of the Intrinsic Retention Characteristics of FLOTOX EEPROM Cells Under Elevated Temperature Conditions", *IEEE Transaction on Electron Devices*, 42, (Apr. 1995), 678–682.

Patel, N. K., et al., "Stress–Induced Leakage Current in Ultrathin SiO2 Films", *Appl. Phys. Letters*, 64(14), (Apr. 1994), 1809–1811.

Rhyne, In: *Fundamentals of Digital Systems Design*, Prentice Hall, New Jersey, (1973), p. 70–71.

Salm, C., et al., "Gate Current and Oxide Reliability in p+ Poly MOS Capacitors with Poly–Si and Poly–Ge0.3Si0.7 Gate Material", *IEEE Electron Device Letters* 19(7), (Jul. 1998), 213–215.

Shi, Ying, et al., "Tunneling Leakage Current in Ultrathin (<4 nm) Nitride/Oxide Stack Dialectrics", *IEEE Electron Device Letters*, 19(10), (Oct. 1998), 388–390.

Wu, Y., et al., "Time Dependent Dielectric Wearout (TDDW) Technique for Reliability of Ultrathin Gate Oxides", *IEEE Electron Device Letters*, 20(6), (Jun. 1999), 262–264.

"Silicon Monoxide", CERAC, inc.–Silicon Monoxide, SIO, (2000), pp. 1–4.

Al–Ani, S.K.J., et al., "The Effect of Temperature of the Optical Absorption Edge of Amorphous Thin Films of Silicon Monoxide", *Phys. Stat. Sol.(b) 123*, (1984), 653–658.

Al–Ani, S.K.J., et al., "The optical absorption edge of amorphous thin films of silicon monoxide", *Journal of Materials Science*, 19, (1984), 1737–1748.

Chand, N., et al., "Tunability of intrinsic stress SiO/sub x/dielectric films formed by molecular beam deposition", *IEE*, (1995), 2 pages.

Chau, R., et al., "30nm Physical Gate Length CMOS Tansistors with 1.0 ps n–MOS and 1.7 ps p–MOS Gate Delays", *IEEE Int. Electron. Devices Meeting, San Francisco*, (Dec., 2000), pp. 45–48.

Chen, Ih–Chin, et al., "A Physical Model for the Gate Current Injection in p–Channel MOSFET's", *IEEE Electron Device Letters, 14 (5)*, (May 1993), 228–230.

Chung, S. S., et al., "Performance and Reliability Evaluations of P–Channel Flash Memories with Different Programming Schemes", *International Electron Devices Meeting, Technical Digest,* Washington, D.C., (Dec. 1997), 295–298.

DeMichelis, F., et al., "Doped amorphous and microcrystalline silicon carbide as wide band–gap material", *Wide Band Gap Semiconductors Symposium, Mat. Res. Soc., Pittsburgh, PA,* (1992), 1 page.

Eldridge, J. M., et al., "Oxidation of Plasma–Deposited a–SixC1–x: H films", *J. Electrochem. Soc.,* vol. 137, No. 7, (Jul. 1990), pp. 2266–2271.

Furusawa, T., et al., "Simple, Reliable Cu/low–k Interconnect Integration Using Mechanically–strong Low–k Dielectric Material: Silicon–oxycarbide", *Proc. IEEE Int. Interconnect Technology Conf.,* (Jun., 2000), pp. 222–224.

Hirayama, M., et al., "Low–Temperature Growth of High–Integrity Silicon Oxide Films by Oxygen Radical Generated in High–Density Krypton Plasma", *IEEE,* (1999), 4 pages.

Ilyas, M., et al., "The optical absorption edge of amorphous thin films of silicon monoxide and of silicon monoxide mixed with titanium monoxide", *IEE,* (2001), 1 page.

Kubaschewski, O., et al., "Oxidation of Metals and Alloys", *Butterworths, London,* (1962), pp. 53–64.

Maiti, B., et al., "Metal Gates for Advanced CMOS Technology", *Proc. Microelectronic Device Technology III,* Santa Clara, CA, 22–23, Soc. of Photo–Optical Instrumentation Engineers, Bellingham WA, (Sep., 1999), pp. 46–57.

Renlund, G. M., "Silicon oxycarbide glasses: Part I. Preparation and chemistry", *J. Mater. Res.,* (Dec., 1991), pp. 2716–2722.

Renlund, G. M., "Silicon oxycarbide glasses: Part II. Structure and properties", *J. Mater. Res.,* vol. 6, No. 12, (Dec., 1991), pp. 2723–2734.

Robinson, G., "Passivation hardens lasers for low–cost package", 3 pages.

Skriver, H. L., et al., "Surface energy and work function of elemental metals", *Physical Review B (Condensed Matter)*, vol. 46, No. 11, (Sep. 15, 1992), 1 page.

Strass, A., et al., "Fabrication and Characterization of thin low–temperature MBE–compatible silicon oxides of different stoichiometry", *Thin Solid Films 349,* (1999), pp. 135–146.

Sze, S. M., "Physics of Semiconductor Devices", *New York, Wiley–Interscience,* ISBN: 0471842907, (1969), 402–407.

Sze, S. M., "Physics of Semiconductor Devices", *Wiley,* (1981), pp. 251, 396.

Tiwari, Sandip, "Volatile and Non–Volatile Memories in Solicon with Nano–Crystal Storage", *Int'l Electron Devices Meeting: Technical Digest,* Washington, DC, (Dec. 1995), 521–524.

\* cited by examiner

STATIC NVRAM WITH ULTRA THIN TUNNEL OXIDES

This application is a Divisional of U.S. application Ser. No. 09/945,398, filed Aug. 30, 2001 now U.S. Pat. No. 6,730,960, which is a Divisional of U.S. application Ser. No. 09/515,630, filed Feb. 29, 2000, now U.S. Pat. No. 6,639,835.

CROSS REFERENCE TO RELATED APPLICATIONS

This application is related to the following co-pending, commonly assigned U.S. patent applications: "Dynamic Flash Memory Cells with UltraThin Tunnel Oxides," Ser. No. 09/513,938, filed Feb. 28, 2000, now U.S. Pat. No. 6,249,460 and "P-Channel Dynamic Flash Memory Cells with UltraThin Tunnel Oxides," Ser. No. 09/514,627, filed Feb. 28, 2000, now U.S. Pat. No. 6,384,448, each of which disclosure is herein incorporated by reference. This application is further related to the following co-pending, commonly assigned U.S. patent applications: "Low Voltage PLA's with UltraThin Tunnel Oxides," Ser. No. 09/515,759, filed Feb. 29, 2000, now U.S. Pat. No. 6,605,961 and "Programmable Low Voltage Decode Circuits with UltraThin Tunnel Oxides," Ser. No. 09/515,115, filed Feb. 29, 2000, now U.S. Pat. No. 6,351,428, which are filed on even date herewith and each of which disclosure is herein incorporated by reference.

FIELD OF THE INVENTION

The present invention relates generally to semiconductor integrated circuits and, more particularly, to structures and methods for static NVRAM with ultra thin tunnel oxides.

BACKGROUND OF THE INVENTION

The use of the one device cell, invented by Dennard in 1967 (see generally, U.S. Pat. No. 3,387,286, issued to R. H. Dennard on Jun. 4, 1968, entitled "Field Effect Transistor memory"), revolutionized the computer industry, by significantly reducing the complexity of semiconductor memory. This enabled the cost, of what was then a scarce commodity, to be drastically reduced.

Today, dynamic random access memories (DRAMs) are a mainstay in the semiconductor industry. DRAMs are data storage devices that store data as charge on a storage capacitor. A DRAM typically includes an array of memory cells. Each memory cell includes a storage capacitor and an access transistor for transferring charge to and from the storage capacitor. Each memory cell is addressed by a word line and accessed by a bit line. The word line controls the access transistor such that the access transistor controllably couples and decouples the storage capacitor to and from the bit line for writing and reading data to and from the memory cell. Current DRAM technology requires a refreshing of the charge stored on the storage capacitor where the charge must be refreshed every so many milliseconds.

Over the course of time what was a very simple device (a planer capacitor and one transistor) has, because of ever shrinking dimensions, become a very complex structure, to build. Whether it is the trench capacitor, favored by IBM, or the stacked capacitor, used by much of the rest of the industry, the complexity and difficulty has increased with each generation. Many different proposals have been proposed to supplant this device, but each has fallen short because of either the speed of the write or erase cycle being prohibitively long or the voltage required to accomplish the process too high. One example of the attempt to supplant the traditional DRAM cell is the so-called electrically erasable and programmable read only memory (EEPROM), or more common today, flash memory.

Electrically erasable and programmable read only memories (EEPROMs) provide nonvolatile data storage. EEPROM memory cells typically use field-effect transistors (FETs) having an electrically isolated (floating) gate that affects conduction between source and drain regions of the FET. A gate dielectric is interposed between the floating gate and an underlying channel region between source and drain regions. A control gate is provided adjacent to the floating gate, separated therefrom by an intergate dielectric.

In such memory cells, data is represented by charge stored on the polysilicon floating gates. The charge is placed on the floating gate during a write operation using a technique such as hot electron injection or Fowler-Nordheim (FN) tunneling. Fowler-Nordheim tunneling is typically used to remove charge from the polysilicon floating gate during an erase operation. A flash EEPROM cell has the potential to be smaller and simpler than a DRAM memory cell. One of the limitations to shrinking a flash EEPROM memory cell has been the requirement for a silicon dioxide gate insulator thickness of approximately 10 nm between the floating polysilicon gate and the silicon substrate forming the channel of a flash field effect transistor. This gate thickness is required to prevent excess charge leakage from the floating gate that would reduce data retention time (targeted at approximately 10 years)

Current-channel flash memories utilize a floating polysilicon gate over a silicon dioxide gate insulator of thickness of the order 100 Å or 10 nm in a field effect transistor. (See generally, B. Dipert et al., *IEEE Spectrum*, pp. 48–52 (October 1993). This results in a very high barrier energy of around 3.2 eV for electrons between the silicon substrate and gate insulator and between the floating polysilicon gate and silicon oxide gate insulator. This combination of barrier height and oxide thickness results in extremely long retention times even at 250 degrees Celsius. (See generally, C. Papadas et al., *IEEE Trans. on Electron Devices*, 42, 678–681 (1995)). The simple idea would be that retention times are determined by thermal emission over a 3.2 electron volt (eV) energy barrier, however, these would be extremely long so the current model is that retention is limited by F-N tunneling off of the charged gate. This produces a lower "apparent" activation energy of 1.5 eV which is more likely to be observed. Since the retention time is determined either by thermal excitation of electrons over the barrier or the thermally assisted F-N tunneling of electrons through the oxide, retention times are even longer at room temperature and/or operating temperatures and these memories are for all intensive purposes non-volatile and are also known as non volatile random access memories (NVRAMs). This combination of barrier height and oxide thickness tunnel oxide thickness is not an optimum value in terms of transfer of electrons back and forth between the substrate and floating gate and results in long erase times in flash memories, typically of the order of milliseconds. To compensate for this, a parallel erase operation is performed on a large number of memory cells to effectively reduce the erase time, whence the name "flash" or "flash EEPROM" originated since this effective erase time is much shorter than the erase time in EEPROMs.

P-channel flash memory cells, having gate oxide thicknesses of approximately 100 Å, have been reported (see generally, T. Ohnakado et al., *Digest of Int. Electron Devices*

*Meeting*, Dec. 10–13, 1995, Washington D.C., pp. 279–282; T. Ohnakado et al., *Digest of Int. Electron Devices Meeting*, Dec. 8–11, 1996, San Francisco, pp. 181–184; T. Ohnakado et al., *Proc. Symposium on VLSI Technology*, Jun. 9–11, 1998), Honolulu, Hi., pp. 14–15) and disclosed (see U.S. Pat. No. 5,790,455, issued Aug. 4, 1998, entitled "Low voltage single supply CMOS electrically erasable read-only memory"). These reported and disclosed p-channel flash memory cells work similar to -channel flash memory cells in that they utilize hot electron effects to write data on to the floating gate. If the magnitude of the drain voltage in a PMOS transistor is higher than the gate voltage, then the electric field near the drain through the gate oxide will be from the gate (most positive) towards the drain (most negative). This can and will cause hot electrons to be injected into the oxide and collected by the floating gate. The mechanisms reported are either channel hot electron injection, CHE, or band-to-band tunneling induced hot electron injection, BTB. The gate current in PMOS transistors (see generally, I. C. Chen et al., *IEEE Electron Device Lett.*, 4:5, 228–230 (1993); and J. Chen et al., *Proceedings IEEE Int. SOI Conf.*, Oct. 1–3, 1991, pp. 8–9) can actually be much higher than the gate current in NMOS transistors (see generally, R. Ghodsi et al., *IEEE Electron Device Letters*, 19:9, 354–356 (1998)) due to the BTB tunneling. Negatively, higher gate current in the PMOS transistors resulting from this BTB tunneling effect limits the performance of deep sub-micron CMOS technology, as reported by R. Ghodsi et al. In other words, the performance of the PMOS array is lowered because the response of the PMOS array is slower.

In co-pending, commonly assigned U.S. patent applications: "Dynamic Flash Memory Cells with UltraThin Tunnel Oxides," Ser. No. 09/513,938, now U.S. Pat. No. 6,249,460, and "P-Channel Dynamic Flash Memory Cells with UltraThin Tunnel Oxides," Ser. No. 09/514,627, now U.S. Pat. No. 6,384,448, dynamic memory cells based on floating gates, like those in flash memory cells, over ultrathin tunneling oxides, are disclosed. In these cases write and erase was accomplished by tunneling through the ultrathin gate oxides. The dynamic nature of the cell resulted from using relatively speaking larger potential variations and amounts of charge stored on the floating gates, as a consequence charge could leak on to, or off of, the floating gate by tunneling of carriers to allowed states in the conduction bands of the insulator, FN tunneling, or semiconductor by band to band, BTB, tunneling. The transistors employed there were normal enhancement mode-channel MOSFETs, or enhancement mode PMOSFETs.

Thus, there remains a need in the art to develop "static," non volatile floating gate transistors, or flash memory cells which can scale down with shrinking design rules and usefully be implemented with ultra thin tunnel gate oxide thicknesses of less than the conventional 100 Å in deep sub-micron CMOS technology devices, i.e. which can replace DRAM cells in CMOS technology devices. That is, it is desirable to develop floating gate transistors which are more responsive, providing faster write and erase times. It is further desirable that such non volatile floating gate transistors have a reliability of a number of cycles of performance equivalent or greater than that of current non volatile memory cells and be able to sense a smaller change in stored charge, e.g. on the order of $10^{-17}$ Coulombs, in a read operation time equivalent to that for conventional DRAM cells, e.g. 1 nanosecond.

SUMMARY OF THE INVENTION

The structures and methods described in the present invention include a "static," non volatile, "depletion mode" p-channel floating gate transistor, or p-channel flash memory cell having an ultra thin tunnel oxide. The memory cell of the present invention, based on tunneling phenomena and ultra thin gate oxides, is best described as a NVRAM, a non volatile random access memory. It operates on a static or DC basis and has stable DC output currents which can be sensed by current sense amplifiers and/or integrated over some period of time on a capacitor and sensed by differential voltage sense amplifiers. The sense operation can be relatively fast, in the nanosecond time frame, and as such could serve as a DRAM replacement. Thus, there is no longer a requirement for large stacked storage capacitors or deep trench storage capacitors. The large capacitors are unnecessary since the cell now is active in nature and the transistor provides a large gain.

The concept used here is based on the fact that for charge loss or gain from a floating gate by tunneling or thermally assisted tunneling to occur there must not only be a high density of initial states (as on the heavily doped floating gate) but also an allowed density of final states. By using PMOS "depletion" mode flash memory devices, even though the tunnel oxide might be ultrathin, e.g. 20–30 Å, there is a range potentials of floating gate for which there are no final nor initial states in the silicon substrate. In this range of potentials there can be no charge leakage, neither a gain nor a charge loss from the floating gate by tunneling or thermally assisted tunneling. In other words the potential of the floating gate can have different states and there will be no change in the charge state, due to leakage currents. The charge state of the floating gate will modulate the conductivity of the underlying transistor channel, with different stable and non-volatile charge states resulting in different conductivity states. This device is then a static and non-volatile memory cell with a least two different memory states possible.

According to one embodiment of the present invention, a non volatile, depletion mode p-channel memory cell is provided. The depletion mode p-channel memory cell includes a control gate. A floating gate is separated from the control gate by a dielectric layer. An oxide layer of less than 50 Angstroms (Å) separates the floating gate from a p-type doped channel region separating a source and a drain region in a substrate. The floating gate of the depletion mode p-channel memory cell is adapted to hold a fixed charge over a limited range of floating gate potentials or electron energies.

According to another embodiment of the present invention, a method for operating a depletion mode p-channel memory cell is provided. The method includes applying a potential of less than 3.0 Volts across a floating gate oxide, which is less than 50 Angstroms, in order to add or remove a charge from the floating gate. The method includes adding only a limited charge to the floating gate such that the floating gate retains a fixed charge when a control gate for the depletion mode p-channel memory cell is grounded. The method further includes reading the depletion mode p-channel memory cell by grounding a control gate for the memory cell and driving the memory cell with a small drain voltage of less than −1.0 Volt.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
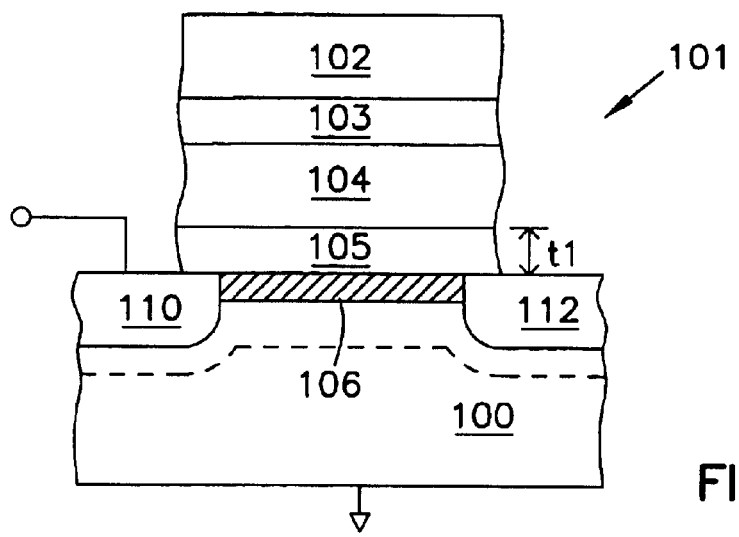
FIG. 1A illustrates a "static," non volatile, "depletion mode" p-channel floating gate transistor, or p-channel memory cell having a tunnel gate oxide of less than 50 Angstroms according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The terms wafer and substrate used in the following description include any base semiconductor structure. Both are to be understood as including bulk silicon material, silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The term conductor is understood to include semiconductors, and the term insulator is defined to include any material that is less electrically conductive than the materials referred to as conductors.

Enhancement mode means that if the transistors have a threshold voltage of some magnitude, VT, then the conduction is enhanced by applying a magnitude of the gate voltage, VGS, in excess of the threshold voltage to attract electrons or holes respectively to the channel and cause conduction between the source and drain. Depletion mode devices, on the other hand, are normally "on" and conduct with no applied gate voltage. The following detailed description is not to be taken in a limiting sense, and the scope of the present invention is defined only by the appended claims, along with the full scope of equivalents to which such claims are entitled.

FIG. 1A illustrates a "static," non volatile, "depletion mode" p-channel floating gate transistor, or p-channel memory cell 101 having a tunnel gate oxide of less than 50 Angstroms according to the teachings of the present invention. The depletion mode p-channel flash memory cell 101 includes a depletion mode p-channel transistor. As shown in FIG. 1A, the depletion mode p-channel flash memory cell 101 of the present invention includes a control gate 102 and a floating gate 104 which can be driven at different potentials. The control gate 102 is separated from the floating gate 104 by an intergate dielectric layer, or intergate oxide 103. In one embodiment the intergate dielectric layer 103 includes a layer of silicon dioxide ($SiO_2$). In an alternative embodiment, the intergate dielectric layer 103 includes a silicon nitride layer ($Si_3N_4$) or any other suitable dielectric layer 103, the invention is not so limited.

FIG. 1A illustrates that the floating gate 104 is separated by an oxide layer, or tunnel gate oxide 105, from a channel region 106. The channel region 106 separates a source region 110 from a drain region 112 in a substrate 100. As one of ordinary skill in the art will understand upon reading this disclosure the source and drain regions, 110 and 112 respectively, include p-type doped source and drain regions, 110 and 112. The p-type doped source and drain regions, 110 and 112, can include heavily doped (p+) source and drain regions, 110 and 112. The substrate includes an n-type substrate or n-well 100.

According to the teachings of the present invention, the oxide layer 105 is an oxide layer which has a thickness (t1)

of less than 50 Angstroms (Å). In one embodiment of the present invention, the oxide layer is approximately 30 Angstroms (Å). In one exemplary embodiment of the present invention, the oxide layer is approximately 23 Angstroms (Å). In one exemplary embodiment, the depletion mode p-channel flash memory cell 101 includes an n-type doped polysilicon floating gate 104 and an n-type doped control gate 102. The n-type doped polysilicon floating gate 104 and the n-type doped control gate 102 can include heavily doped (n+) polysilicon floating and control gates, 104 and 102 respectively. As shown in FIG. 1A, the depletion mode p-channel flash memory cell 101 of the present invention has an implanted p-type conduction channel 106 which is normally on or conducting with no applied gate voltage.

Figure 1B:
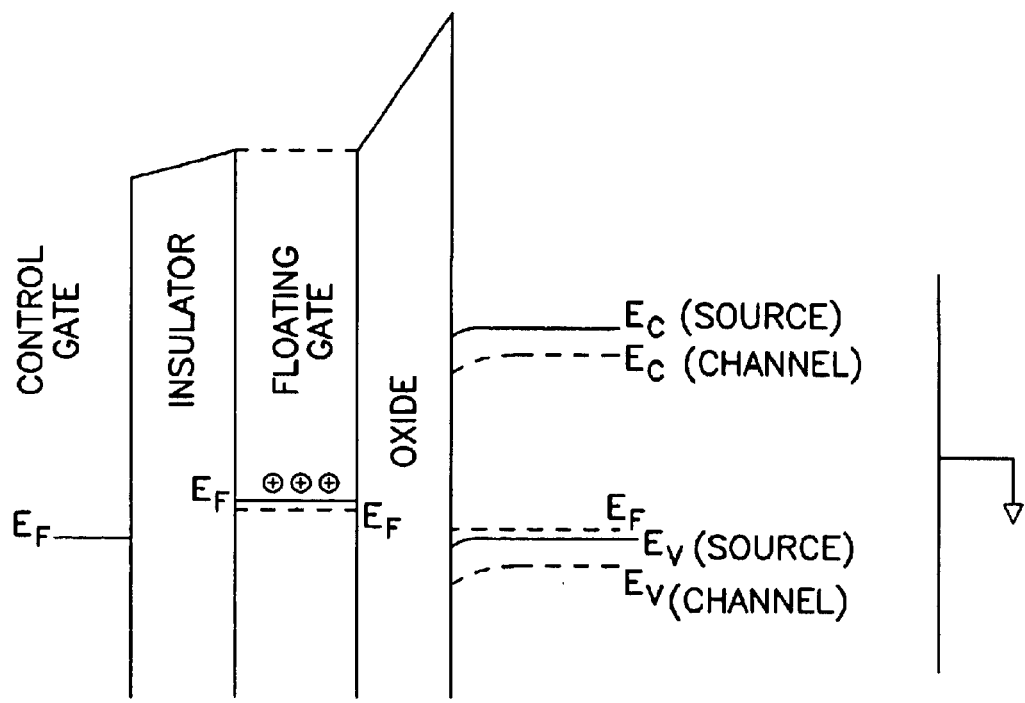
FIG. 1B is an energy band diagram which illustrates generally the relative valence, conduction, and Fermi energy band levels of the device of the present invention in an equilibrium condition if the control gate were grounded and after a theoretical infinite amount of time has elapsed.

FIG. 1B is an energy band diagram which illustrates generally the relative valence, conduction, and Fermi energy band levels of the device in an equilibrium condition if the control gate were grounded and after a theoretical infinite amount of time has elapsed. If the control gate 102 is grounded and the source region 110 is grounded then the Fermi level in the control gate 104 and the source region 110 must line up or be at the same potential. The work functions of the n+ poly gates, 102 and 104, and the work function of the p+ silicon source region, 110, are quite different. If the n+ poly control gate 102 is grounded this tends to pull the bands down to a lower energy state, in the same sense that the work function difference in an NMOS transistor on a p-type substrate tends to invert the substrate and try to collect electrons at the silicon surface. If temperatures are high enough and/or enough time has elapsed, this may be a very long time, then the structure must come to thermal equilibrium where the Fermi levels in the control gate and the p+ source region line up and the structure satisfies the electrostatic constraints to be charge neutral. This solution is shown in FIG. 1B where some electrons have escaped from the floating gate 104 and the floating gate 104 has a small positive charge. This solution satisfies all electrostatic and potential considerations and constraints.

Figure 2A:
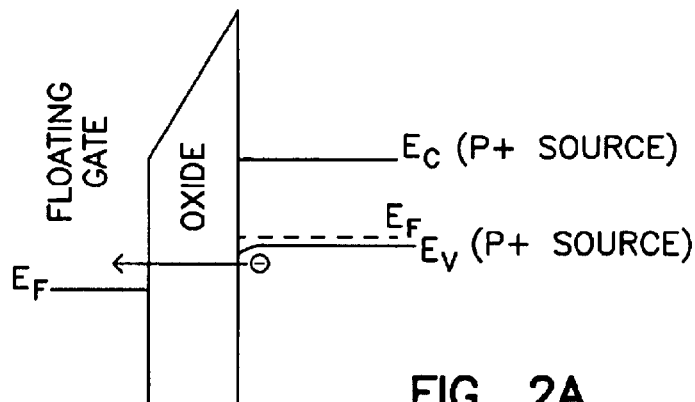
FIG. 2A is an energy band diagram which illustrates generally the write operation for the depletion mode, p-channel flash memory cell according to the teachings of the present invention.

FIG. 2A is an energy band diagram which illustrates generally the write operation for the depletion mode, p-channel flash memory cell according to the teachings of the present invention. As shown in FIG. 2A, a charge can be injected from the p+ source region to the floating gate by driving the control gate to a large positive voltage which increases the potential of the floating gate, reduces electron energy, and causes valence band electrons in the p+ source region to tunnel on to the floating gate. The charge on the floating gate can be changed from a positive value to a neutral or even negative charge condition. According to one embodiment of the present invention having ultra thin tunnel gate oxides, a charge of approximately $10^{-17}$ Coulombs, or approximately 100 electrons is placed on the floating gate. The tunneling of charge to the floating gate can be achieved by FN tunneling, or by band to band, BTB, tunneling.

Figure 2B:
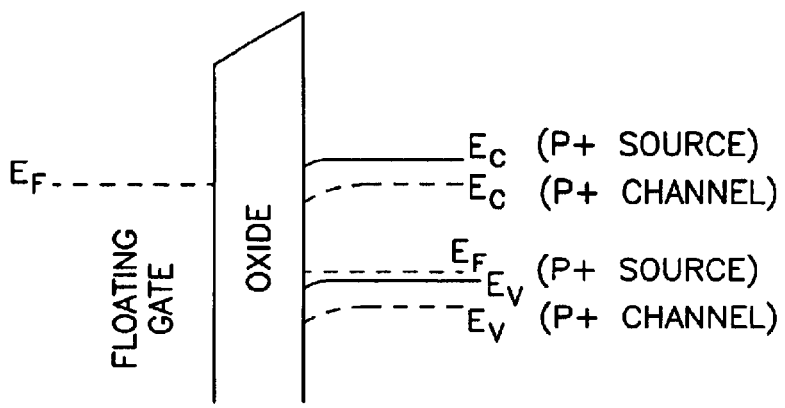
FIG. 2B is an energy band diagram which illustrates generally the floating gate for the depletion mode, p-channel flash memory cell, according to the teachings of the present invention, on to which electrons have been injected.

FIG. 2B is an energy band diagram which illustrates generally the floating gate on to which electrons have been injected and the large positive potential on the control gate removed. The potential of the floating gate will decrease or the energy of electrons on the floating gate will increase. However, if not too many electrons are injected on to the floating gate, e.g. a charge of approximately $10^{-17}$ Coulombs, or approximately 100 electrons for a floating gate having a bottom surface area of approximately $10^{-17}$ cm$^2$ in the device of the present invention having an ultra thin tunnel gate oxide, they can not escape back to the silicon substrate since there are no available states in the silicon to which they can tunnel. When the control gate goes back to ground potential, or a negative potential, electrons will be trapped on the floating gate. These electrons cannot escape by tunneling to the substrate or source until the floating gate potential becomes about one voltage negative and the Fermi energy level in the floating gate aligns with the conduction band in the channel or the source region. In between these two potentials the band gap in the silicon substrate, or p+ source region has no final electron states into which the electrons can tunnel.

Figure 2C:
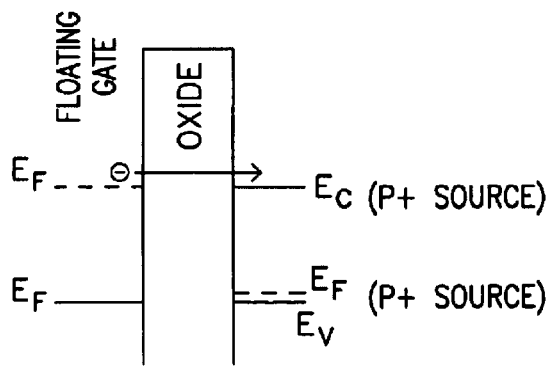
FIG. 2C is an energy band diagram which illustrates the point at which electrons can begin escaping from the floating gate by F-N tunneling back to the silicon substrate for the depletion mode, p-channel flash memory cell according to the teachings of the present invention.

FIG. 2C is an energy band diagram which illustrates the point at which electrons can begin escaping from the floating gate by F-N tunneling back to the silicon substrate, or p+ source region. Once a sufficient negative potential is provided on the floating gate, the Fermi level in the floating will be above the energy level of available final states in the substrate, or p+ source region. As long as the floating gate potential does not go too far negative the electron charge will remain on the floating gate.

Figure 2D:
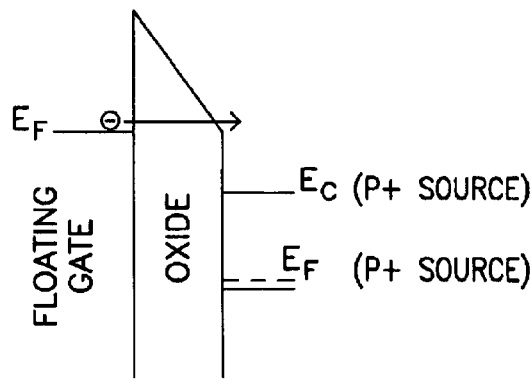
FIG. 2D is an energy band diagram which illustrates generally the erase operation for the depletion mode, p-channel flash memory cell according to the teachings of the present invention.

FIG. 2D is an energy band diagram which illustrates generally the erase operation for the depletion mode, p-channel flash memory cell according to the teachings of the present invention. Electrons can be removed from the floating gate by driving the control gate to a sufficiently large negative potential. The Fermi level in the floating gate will then be above the energy level of available final states in the substrate, or p+ source region. When the floating gate is driven to this sufficiently large negative potential the electrons can tunnel back to the silicon substrate, or p+ source region by FN tunneling or BTB tunneling. In this case there is a high density of available final states either in the oxide or silicon substrate/p+ source region conduction bands.

Figure 3A:
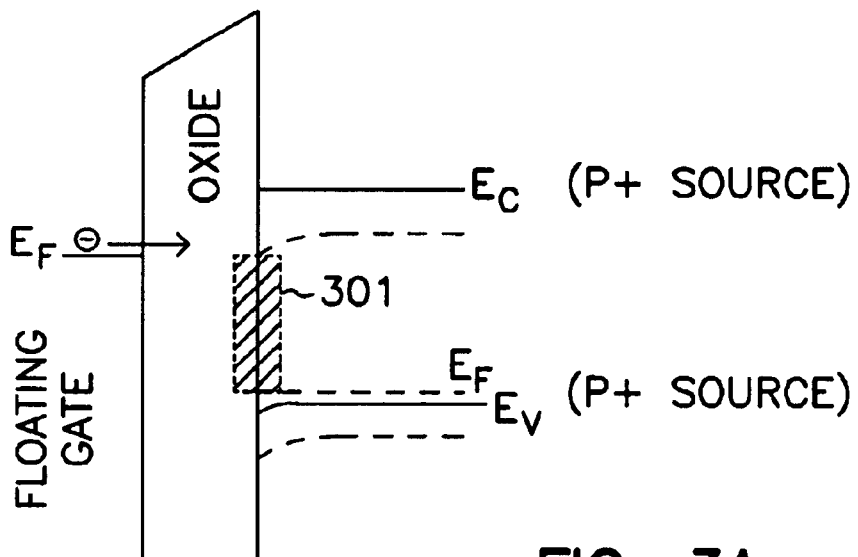
FIGS. 3A and 3B are energy band diagrams which illustrate that for the depletion mode p-channel memory cell of the present invention, there is a limited range of floating gate potentials or electron energies for which electrons can neither tunnel back to the silicon substrate, or p+ source region, nor electrons tunnel from the silicon substrate, or p+ source region, to the floating gate.
Figure 3B:
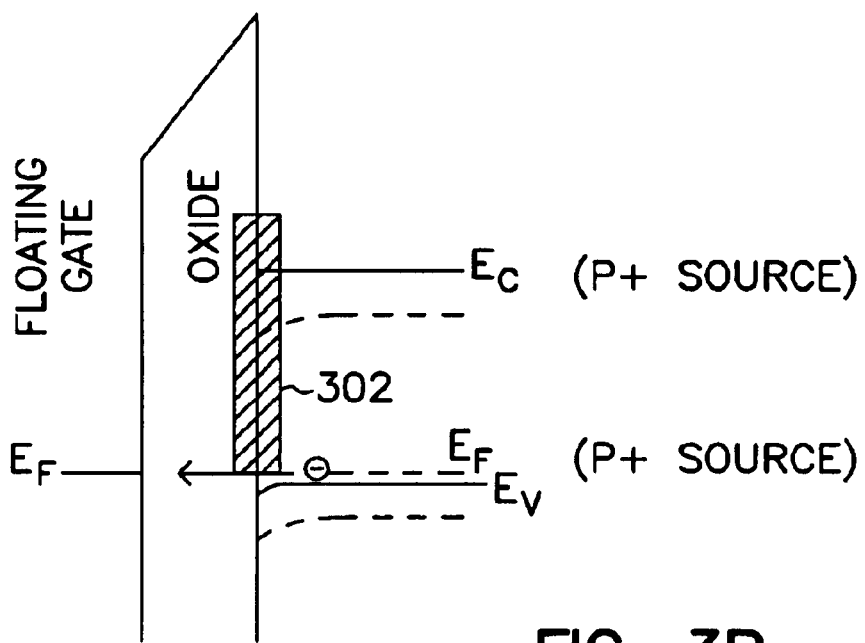

FIGS. 3A and 3B are energy band diagrams which illustrate that there is only a limited range of floating gate potentials or electron energies from which electrons can neither tunnel back to the silicon substrate, or p+ source region, nor electrons tunnel from the silicon substrate, or p+ source region, to the floating gate.

FIG. 3A is an energy band diagram illustration of the depletion mode, p-channel flash memory cell shown in FIG. 2B approaching the state of FIG. 2C. Here a charge has been stored on the floating gate. The floating gate is below the maximum electron energy and above the minimum applied potential as would be necessary to effectuate a change of the fixed charge on the floating gate, as would begin in the state shown in FIG. 2C. That is, the energy magnitude of the electrons stored on the floating gate is not sufficient for these electrons to escape back to the substrate, or p+ source region. In this first case of FIG. 3A there are no available final states, as represented by the shaded region 301, in the silicon substrate/p+ source region. That is, the electrons in FIG. 3A do not have enough energy to reach any of the available final states in the conduction band of the silicon substrate/p+ source region. The Fermi level in the floating gate lines up with the band gap, which has no states in the silicon substrate, or p+ source region.

On the other hand, FIG. 3B is an energy band diagram illustration of the depletion mode, p-channel flash memory cell with no charge stored on the floating gate moving toward the write operation energy band diagram shown in FIG. 2A. The floating gate is at a minimum electron energy and below a maximum applied potential as would be necessary to cause electrons to tunnel from the substrate, or p+ source region, on to the floating gate, as would begin in the state shown in FIG. 2A. That is, the energy magnitude of the electrons in the substrate, or p+ source region, is not sufficient for these electrons to tunnel to the floating gate. In this second case of FIG. 3B, the states to which electrons from the valence band in the silicon substrate, or p+ source region might tunnel from are aligned below the Fermi level states in the floating gate, e.g. Fermi level states which are already filled as represented by shaded region 302. Once again, there are no available final states, region 302, to which to tunnel. Thus there is a range of potentials, or charge on the floating gate, where the charge on the floating gate will remain stable and not change due to tunneling leakage current. The device will act as a static non-volatile memory cell, the charge will not change, and because of the transistor action the charge can be sensed in a non-destructive manner, i.e. the charge state can be indirectly determined and sensed.

In one embodiment of the present invention, the depletion mode, p-channel flash memory cell has a tunnel gate oxide thickness of less than 30 Å. The floating gate has a bottom surface area of approximately $10^{-10}$ cm$^2$. In this embodiment, which is given by way of illustration and not by way of limitation, there will be a range of floating gate potentials of about 1.0 Volts, and a floating gate charge of approximately $10^{-17}$ Coulombs, or approximately 100 electrons, where the device can retain a fixed charge on the floating gate. That is, the normal operating voltage is with a floating gate potential of about 1.0 Volts or less positive. This is provided by biasing the control gate at a positive voltage slightly in excess of +1.0 Volts. This normal bias condition serves to turn "off" the implanted depletion mode p-type channel. If the negative charge electrons are stored on the floating gate, then the floating gate potential can be up to 1.0 Volts more negative before electrons can escape. This negative charge on the floating gate will result in a higher conductivity state of the depletion mode, p-channel flash memory cell, as explained more in connection with FIGS. 4A–4D. Under normal operation, the depletion mode, p-channel flash memory cell has two different conductivity states depending upon whether electrons are stored on the floating gate. These two different states are a low DC conductivity state without stored charge and a higher conductivity state when electrons are stored on the floating gate. It is noted that for the depletion mode, p-channel flash memory cell of the present invention, the control gate is driven positive for cell operation which is in opposite polarity to the negative voltages normally employed in conventional PMOS circuits.

Figure 4A:
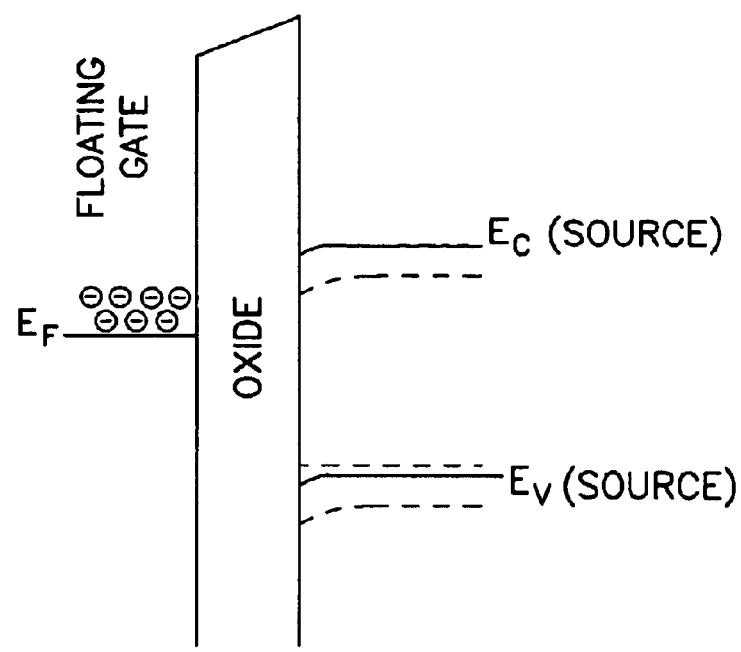
FIGS. 4A–4D outline the sense operation of the non volatile, depletion mode p-channel memory cell according to the teachings of the present invention.
Figure 4B:
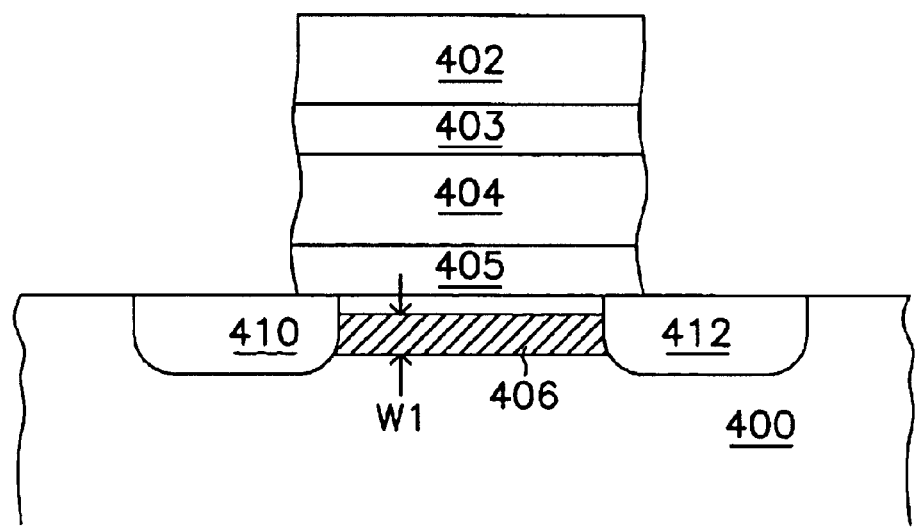

FIGS. 4A–4D outline the sense operations in more detail. In FIG. 4A, the floating gate charge is in its most negative allowed charge state, similar to that shown in FIG. 3A. This most negative allowed charge state will not force holes in the p-type channel in the substrate away from the surface. If anything the most negative allowed charge state will tend to attract holes in the p-type channel. As a result, as shown in FIG. 4B, the p-type conductive channel in the substrate will have its maximum width (W1) and the depletion mode, p-channel flash memory cell of the present invention will be most conductive between the source and drain, e.g. sensing an "on" state in a positive logic scheme.

Figure 4C:
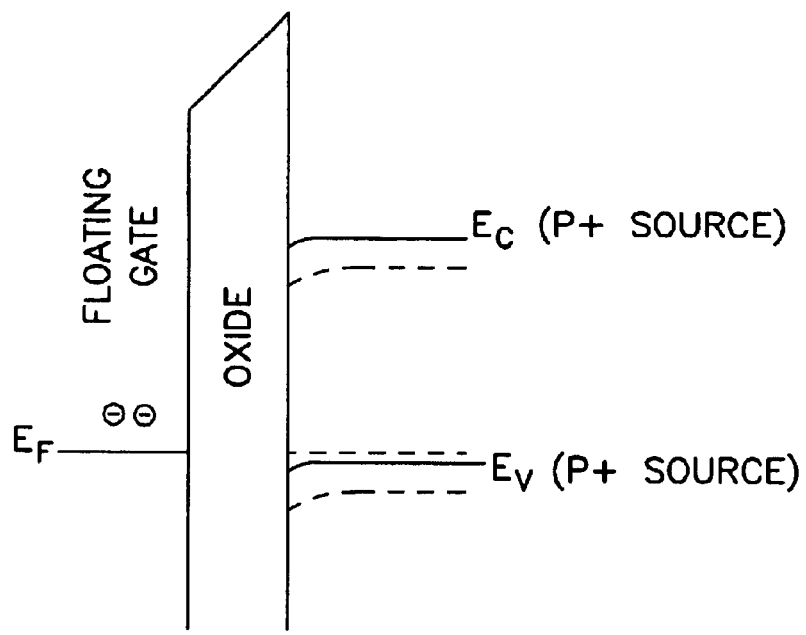
Figure 4D:
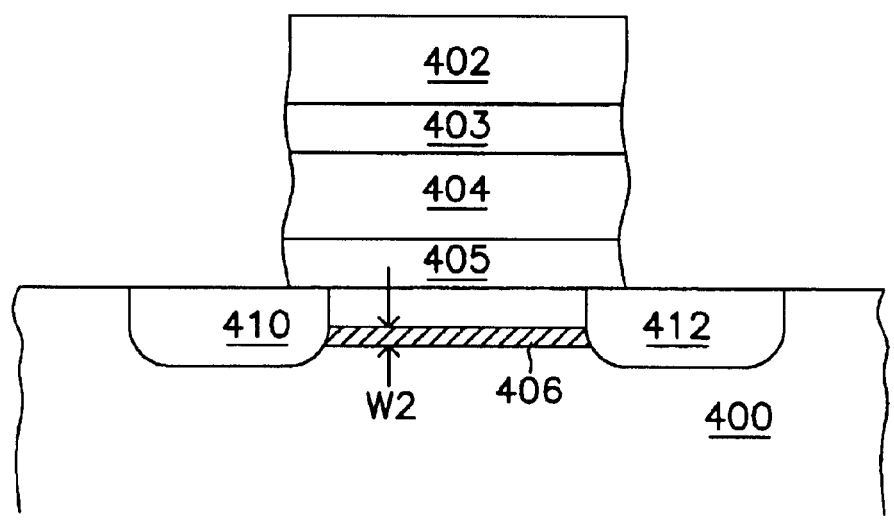

In FIG. 4C, the charge on the floating gate is at its most positive charge state, similar to that shown in FIG. 3B. Here, the positive charge on the floating gate will repel holes in the silicon p-type channel and form a surface space charge or depletion layer in the silicon substrate. As shown in FIG. 4D, the p-type channel will have its minimum width (W2) and the lowest conductivity, e.g. sensing an "off" state in a positive logic scheme.

Figure 5:
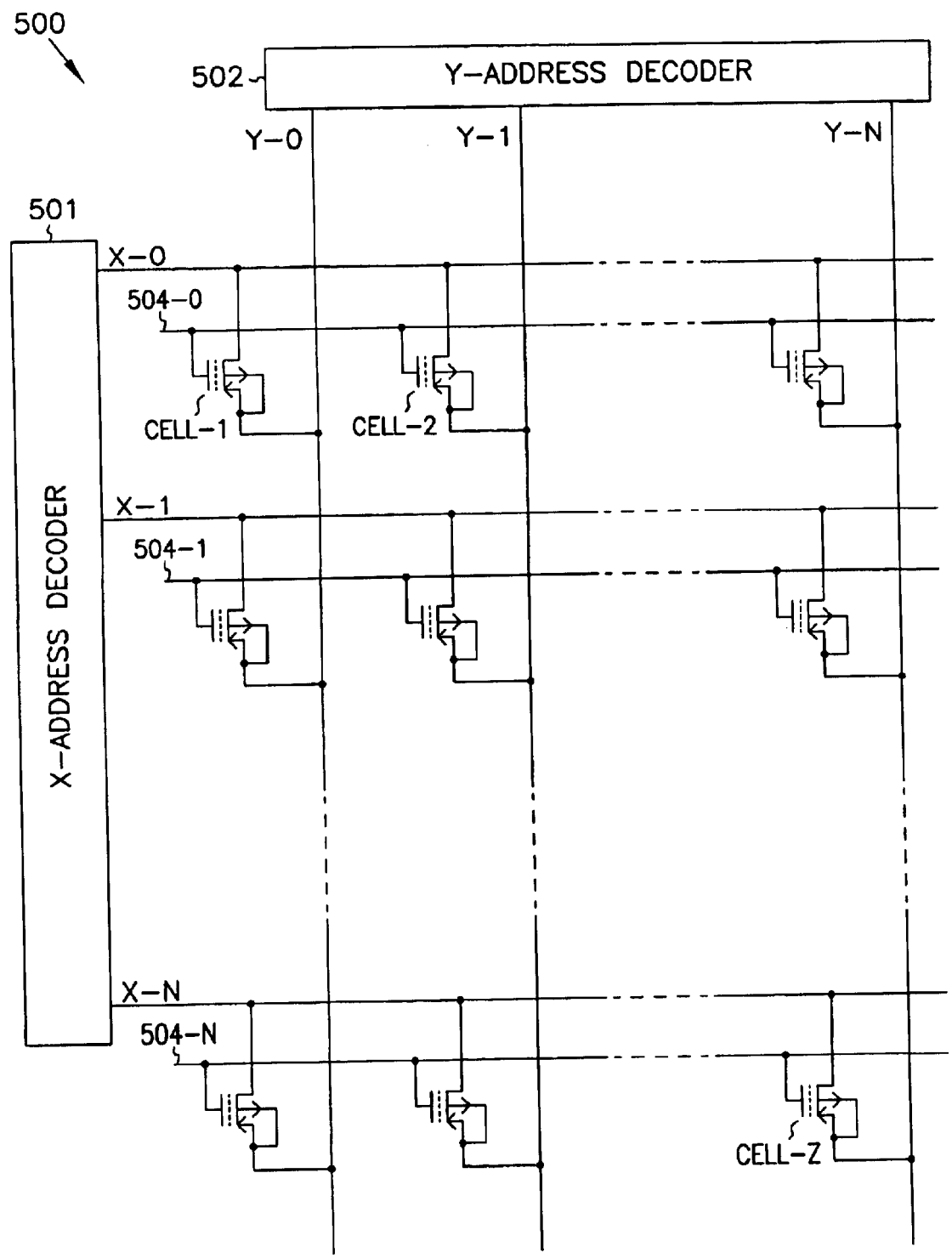
FIG. 5 illustrates the depletion mode, p-channel flash memory cell of the present invention in a memory cell array.

FIG. 5 further illustrates the sensing operation for the depletion mode, p-channel flash memory cell of the present invention in a memory cell array 500. As illustrated in FIG. 5, this conductivity state can be sensed by placing the depletion mode, p-channel flash memory cells, Cell-1, Cell-2, . . . , Cell-Z, of the present invention in addressed memory arrays and measuring the conductivity of the p-type channel when there is a coincidence in the x-y address decoders, 501 and 502 respectively. During these read operations the control gate lines, 504-0, 504-1, . . . , 504-N, would remain at ground potential. There are some engineering design considerations and trade-offs, and different possible implementations here. In the simplest case only the difference between two finite conductivity states need be determined, and the transistor need only be driven with a small drain voltage (VD).

Again, during the read operation shown in FIG. 5, the control gate lines, 504-0, 504-1, . . . , 504-N, remain at ground potential. A whole row, or word, is erased at one time by grounding all source or column lines, Y-0, Y-1, . . . , Y-N, for the whole row, or word, and driving the control gate line, e.g. 504-0, for the whole row, or word, negative causing electrons to tunnel off of the floating gates in that row, or word. Data is written selectively on to certain memory cells, e.g. Cell-0 and Cell-1, by driving selected column lines, Y-0 and Y-1, negative and the respective control gate line 504-0 positive. In this manner different data or bit patterns can be written into Cell-0 and Cell-1 in the X-0 row, or word.

Figure 6:
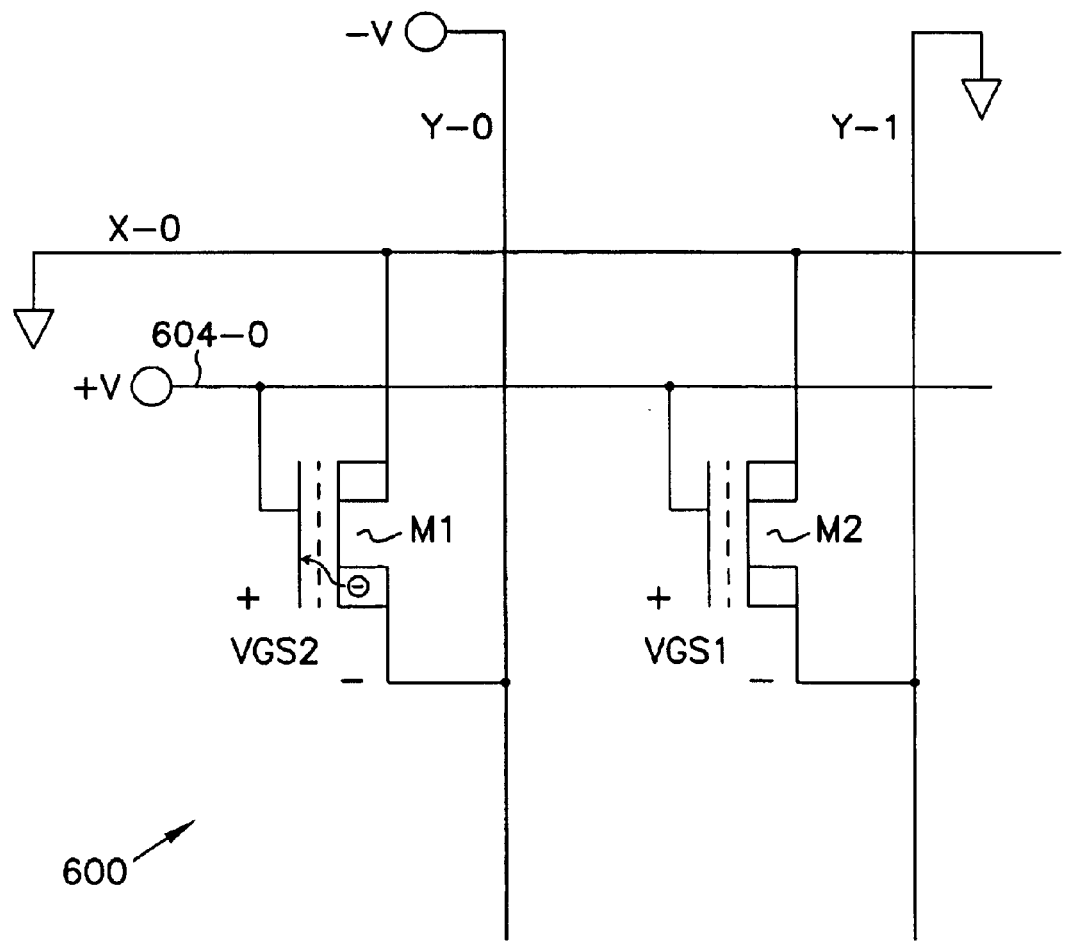
FIG. 6 is a schematic diagram which illustrates in more detail the write operation showing two depletion mode, p-channel flash memory cells of the present invention with the different possible state conditions.

FIG. 6 is a schematic diagram which illustrates in more detail the write operation showing two depletion mode, p-channel flash memory cells M1 and M2 being programmed with the two different possible state conditions in a portion of an array 600. In FIG. 6, memory cell, M1 is being programmed by electron injection on to the floating gate. M1 is shown with its source line, Y-0, driven negative. M2 is shown with its source line, Y-1, grounded. M1 and M2 have a large positive voltage applied to their control gate line 604-0. As shown in FIG. 6, memory cell M1 has a larger gate to source voltage (VGS2) than a gate to source voltage (VGS1) in memory cell M2 since the source line of M1 is driven negative. In both memory cells, M1 and M2, the row/drain line, X-0, is grounded. The control gate voltage is large enough in both memory cells, M1 and M2, so that the depletion mode, p-channel flash memory cells of the present invention will not conduct from drain to source in spite of electron tunneling to the floating gate of memory cell M1. There may be some minor disturbance in that some small amounts of charge may be injected on to floating gates of other depletion mode, p-channel flash memory cells of the present invention within the same array where their control gate is grounded, not driven positive. However, tunneling currents are extremely strong exponential functions of potential differences, as disclosed by T. P. Ma et al., *IEEE Electron Device Letters*, vol. 19: no. 10, pp. 388–390 (1998), and so the amount will be very small indeed. Again, the control gate line 604-0 is driven far enough positive that none of the transistors will conduct between source and drain so that the only current drawn by the negative column line, Y-0, is the tunneling current from source region to the floating gate on the memory cell, M1, being programmed.

In co-pending, commonly assigned U.S. patent applications: entitled, "Dynamic Flash Memory Cells with UltraThin Tunnel Oxides," Ser. No. 09/513,938, now U.S. Pat. No. 6,249,460, and "P-Channel Dynamic Flash Memory Cells with UltraThin Tunnel Oxides," Ser. No. 09/514,627, now U.S. Pat. No. 6,384,448, each of which disclosure is herein incorporated by reference, it was shown that if ultra thin tunnel gate oxides are used then the write, erase, and read operations will be relatively fast as compared with conventional DRAM technology. For example, these disclosures demonstrate that if a 2.3 nm or 23 Å gate oxide is used with a voltage of 2.3 V the electric field will be 10.0 MV/cm. The current density produced will be large, approximately 0.5 A/cm². This is a tunneling current as disclosed by T. P. Ma et al., *IEEE Electron Device Letters*, vol. 19: no. 10, pp. 388–390 (1998).

To illustrate the effectiveness of the sensing operation for the two different conductivity states in the depletion mode, p-channel memory cell of the present invention, the following calculations are provided. First, the capacitance of a tunnel gate oxide (Cox) is $1.5 \times 10^{-6}$ Farads/cm². In a 0.1 micron CMOS technology, the gate oxide (Cox) capacitance will be about 0.15 fF. There will be a change in the floating gate potential of $\Delta V = \Delta Q/C$. If the write and erase times are approximately 200 nanoseconds (nS), as shown in the above cited disclosures, then, $\Delta Q = 0.5$ A/cm²×200 nanoseconds, or approximately 100 electrons. Thus, $\Delta V = \Delta Q/C = 100 \times 10^{-19}$ C/0.15 fF. Thus, there will be a $\Delta V$ of about 70 mV.

The drain to source current is given by:

$$|IDS| = (\varepsilon C_o)(W/L) \frac{(VGS - VT)^2}{2}$$

where $\varepsilon$ is the carrier mobility, $C_0$ is the tunnel gate oxide capacitance, W and L are the width and length of the device respectively, VGS is the potential applied across the floating gate to source region, and VT is the threshold voltage for the device. Since VT approaches VT+$\Delta$VT, the equation can be restated as:

$$|\Delta I| = \left(100 \frac{\mu A}{V^2}\right)(1/1)((VGS - VT)\Delta VT)$$

while substituting in appropriate values for $\mu$ and $C_0$, and assuming a device having a 1 to 1 width to length ratio. Taking VGS−VT to be approximately 0.5 Volts in devices with 1.0 Volt operating voltages, and having shown the change in threshold voltage ($\Delta$VT) to be approximately 70 milliVolts, then the change in drain current $\Delta I$ is as follows:

$$\Delta I = 100 \frac{\mu A}{V^2}(1/1)(0.5)(0.07) = 3.5 \ \mu A.$$

Thus, this 70 mV change in gate potential will result in a difference in the drain current of a few microAmperes.

The change in the potential sensed on the drain line can be further calculated as above. That is, there will be a change in the drain line potential of $\Delta V = \Delta Q/C$. If the read current is sensed for 1.0 nanosecond, $t_{sense} = 1$ ns, and if the drain line capacitance is 35 fF then the difference signal on the drain line or data line will be $\Delta V = \Delta Q/C = 3.5 \ \mu A \times 10^{-9}/35$ fF, or about 100 mV. This difference signal of 100 mV is sufficient to be sensed by a differential sense amplifier. Because the write and erase operations are performed in parallel the effective write and erase times per single data bit will be much faster than 200 nS.

Figure 7A:
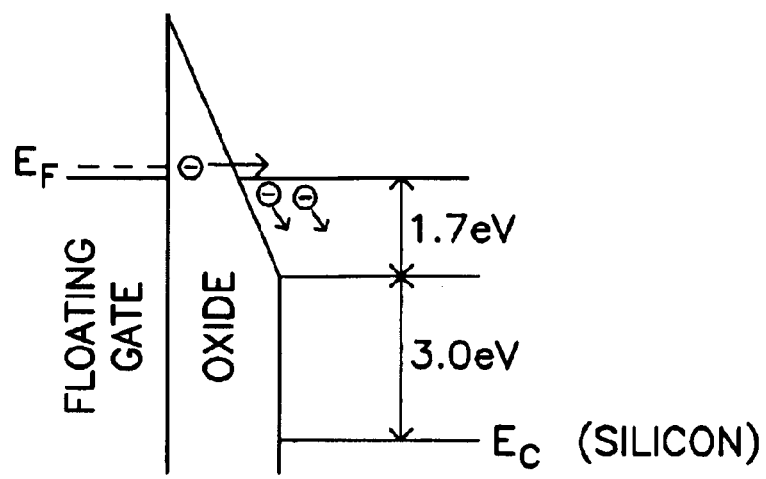
FIGS. 7A and 7B is are energy band diagram which illustrates generally F-N tunneling and Band to Band (BTB) tunneling of stored electrons off of and on to a floating gate according to the teachings of the present invention.
Figure 7B:
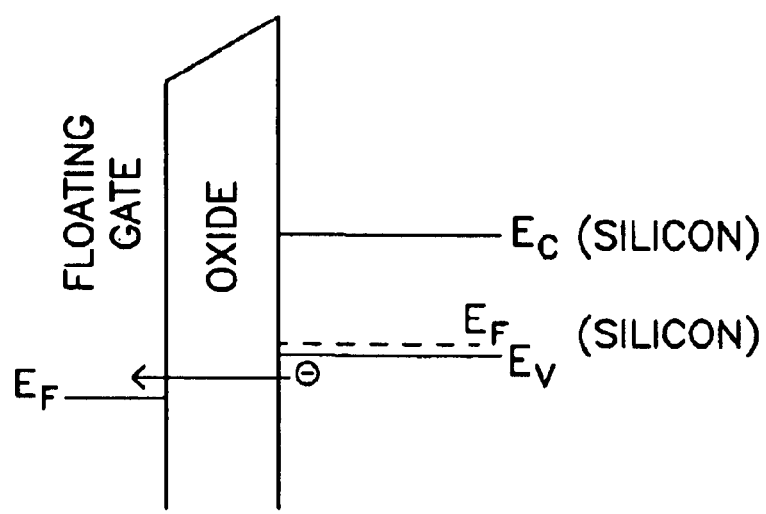

In co-pending, commonly assigned U.S. patent applications: entitled, "Dynamic Flash Memory Cells with UltraThin Tunnel Oxides," Ser. No. 09/513,938, now U.S. Pat. No. 6,249,460, and "P-Channel Dynamic Flash Memory Cells with UltraThin Tunnel Oxides," Ser. No. 09/514,627, now U.S. Pat. No. 6,384,448, each of which disclosure is herein incorporated by reference, it was further shown that some very long mean times to failure have been reported on ultrathin tunnel oxides. For example, with an electric field in the gate oxide of 10MV/cm, as disclosed by G. Lucovsky et al., *IEEE Electron Device Letters*, vol. 20: no. 6, pp. 262–264 (1999), these include up to 19 years with 23 Å or 2.3 nm oxides. There is good reason to believe in the case of FN tunneling that there is a minimum potential or energy of around 4.7V which is required to cause damage in a tunnel gate oxide, 3.0 eV to overcome the silicon-oxide barrier and 1.7 eV required for acceleration of the electrons in the conduction band of the oxide, as disclosed by G. Lucovsky et al., *IEEE Electron Device Letters*, vol. 20: no. 6, pp. 262–264 (1999); and N. Patel et al., *Appl. Phys. Lett.*, vol. 64: no. 14, 1809–11 (1994). This is illustrated in FIG. 7A. In the case of band to band tunneling, BTB, this is a quantum mechanical effect and no direct collisions occur between electrons and atoms in the oxide so again there would be no damage in the oxide. BTB tunneling as applied in these devices is illustrated in FIG. 7B. Recent investigations, as disclosed by D. A. Muller et al. "The electronic structure at the atomic scale of ultrathin gate oxides," Nature, vol. 399, pp. 758–761, 24 Jun. 1999, suggest that gate oxides as thin as 12 Å or 1.2 nm may eventually be used in CMOS devices. Thus, there may be good scientific basis to believe that ultrathin tunnel gate oxides may in fact be much more reliable than the current 100 Å or 10 nm gate oxides used in flash memory devices.

Figure 8:
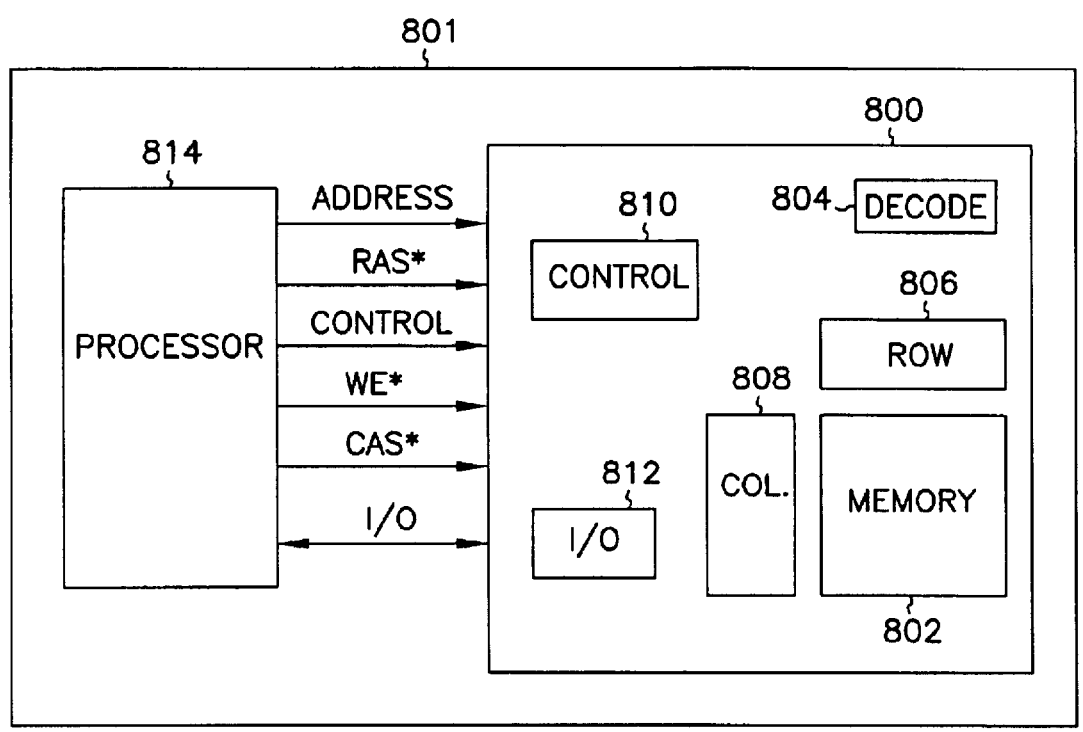
FIG. 8 illustrates a block diagram of an embodiment of a circuit on a single substrate, or an electronic system on a chip, according to the teachings of the present invention.

FIG. 8 illustrates a block diagram of an embodiment of a circuit on a single substrate 801, or an electronic system on a chip 801 according to the teachings of the present invention. In the embodiment shown in FIG. 8, the circuit, or system 801 includes a memory device 800 which has an array of memory cells 802, address decoder 804, row access circuitry 806, column access circuitry 808, control circuitry 810, and input/output circuit 812. Also, as shown in FIG. 8, the circuit 801 includes a processor 814, or memory controller for memory accessing. The memory device 800 receives control signals from the processor 814, such as WE*, RAS* and CAS* signals over wiring or metallization lines. The memory device 800 is used to store data which is accessed via I/O lines. It will be appreciated by those skilled in the art that additional circuitry and control signals can be provided, and that the memory device 800 has been simplified to help focus on the invention. At least one of the memory cells 802 has a memory cell formed according to the embodiments of the present invention.

It will be understood that the embodiment shown in FIG. 8 illustrates an embodiment for the circuitry of a non volatile, depletion mode p-channel memory array with ultra thin tunnel oxides according to the teachings of the present invention. The illustration of a circuit or system 801 as shown in FIG. 8 is intended to provide a general understanding of one application for the structure and circuitry of the present invention, and is not intended to serve as a complete description of all the elements and features of a non volatile, depletion mode p-channel memory array with ultra thin tunnel oxides. Further, the invention is equally applicable to any size and type of memory circuit 801 using the non volatile, depletion mode p-channel memory array with ultra thin tunnel oxides of the present invention and is not intended to be limited to the described above. As one of ordinary skill in the art will understand, such single-package processing units as described in FIG. 8 reduce the communication time between the processor and the memory circuit.

As recognized by those skilled in the art, circuits of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Other circuits containing the non volatile, depletion mode p-channel memory array with ultra thin tunnel oxides described in this disclosure include circuitry for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Figure 9:
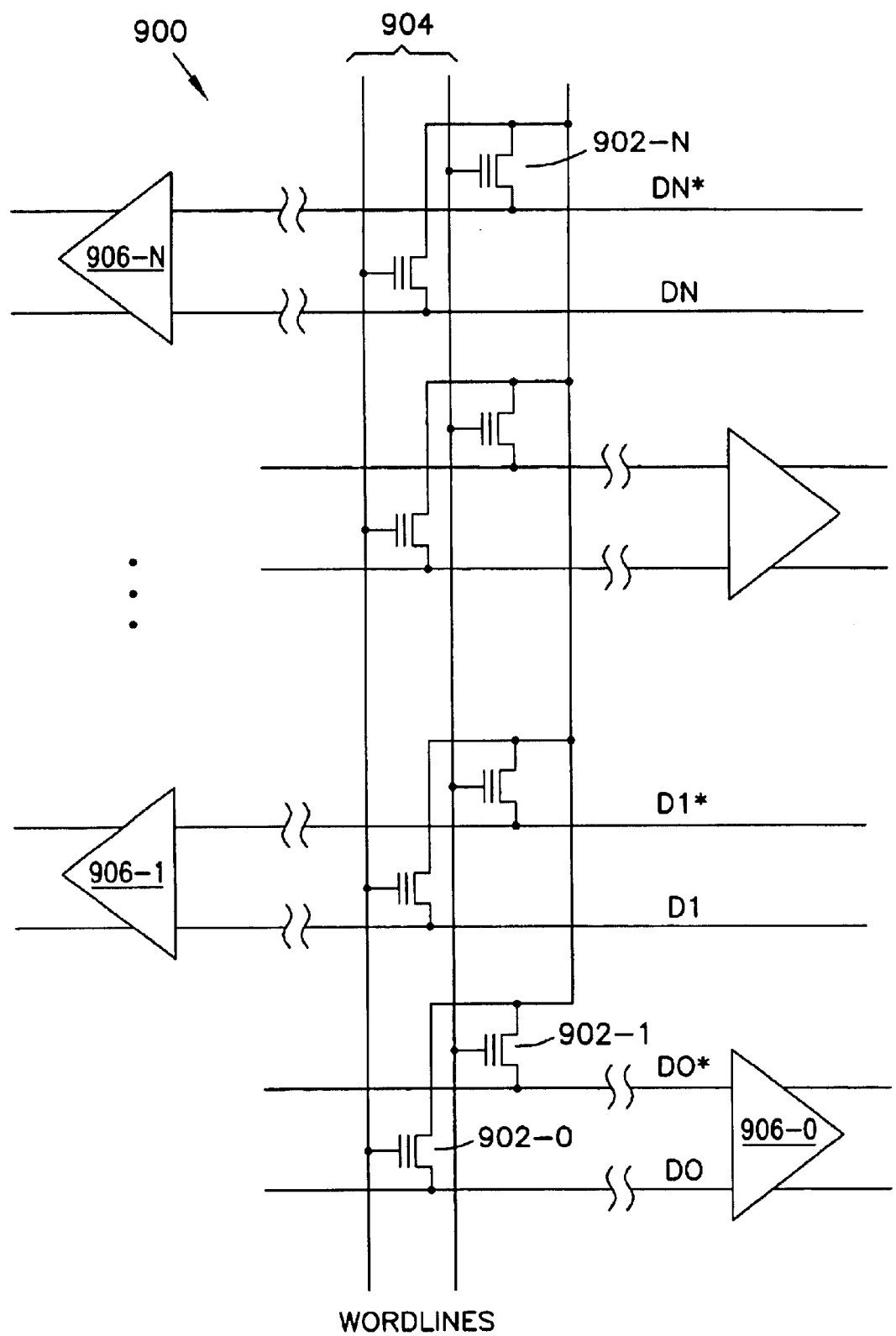
FIG. 9 illustrates an embodiment of a memory array, according to the teachings of the present invention, as can be included in a memory device, e.g. on a memory chip/die.

FIG. 9 illustrates an embodiment of a memory array 900, according to the teachings of the present invention, as can be included in a memory device, e.g. on a memory chip/die. The memory array shown in FIG. 9 includes a plurality of memory cells, 902-0, 902-1, . . . , 902-N. The plurality of memory cells, 902-0, 902-1, . . . , 902-N, includes at least one non volatile, depletion mode p-channel memory cell formed according to the teachings of the present invention. That is, the at least one non volatile, depletion mode p-channel memory cell includes a source region and a drain region with a p-type doped channel therebetween. A floating gate is separated from the p-type doped channel region by an oxide layer, or tunnel gate oxide having a thickness of less than 50 Å. As shown in FIG. 9, the plurality of memory cells are coupled to a plurality, or number of sense amplifiers 906-0, 906-1, . . . , 906-N via a number of bit lines, or digitlines, D0*, D0, D1*, D1, . . . , DN*. FIG. 9 is illustrative of the manner in which the non volatile, depletion mode p-channel memory cells of the present invention can be used in a folded bit line configuration, in substitution for a conventional folded bit line DRAM array. One of ordinary skill in the art will understand upon reading this disclosure, that the non volatile, depletion mode p-channel memory cells of the present invention can further be used in an open bit line configuration or any other digitline twist scheme. The invention is not so limited. One of ordinary skill in the art will further understand upon reading this disclosure that non volatile, depletion mode p-channel memory cells of the present invention allow a smaller change in stored charge on the floating gate to be detected.

The Figures presented and described in detail above are similarly useful in describing the methods of the present invention. That is one embodiment of the present invention includes a method for forming a depletion mode p-channel memory cell. The method includes forming an oxide layer of less than 50 Angstroms (Å) on a substrate having a p-type doped channel region separating a source and a drain region in the substrate. A floating gate is formed on the oxide layer. A dielectric layer is formed on the floating gate. Further control gate is formed on the dielectric layer. In one embodiment, forming the oxide layer includes forming the oxide layer to have a thickness of 23 Angstroms (Å). Forming the floating gate includes forming a floating gate which has a bottom layer surface area of approximately $10^{-10}$ cm$^2$, and which is adapted to hold a fixed charge on the order of $10^{-17}$ Coulombs. As one of ordinary skill in the art will understand upon reading this disclosure forming the depletion mode p-channel memory cell includes forming a non volatile depletion mode p-channel memory cell where the floating gate which is adapted to hold a fixed charge over a limited range of floating gate potentials.

In another embodiment, a method of forming a memory device is provided. The method includes forming a plurality of memory cells. Forming the plurality of memory cells includes forming at least one depletion mode p-channel memory cell according to the embodiments disclosed above. The method further includes forming at least one sense amplifier. Forming at least one sense amplifier includes coupling the at least one amplifier to the plurality of memory cells.

In another embodiment of the present invention, a method for operating a depletion mode p-channel memory cell is provided. The method includes applying a potential of less than 3.0 Volts across a floating gate oxide, wherein the floating gate oxide is less than 50 Angstroms, in order to add or remove a charge from the floating gate. The method further includes reading the depletion mode p-channel memory cell by grounding a control gate for the memory cell and driving the memory cell with a small drain voltage of less than −1.0 Volt. Applying a potential of less than 3.0 Volts across a floating gate oxide in order to add or remove a charge from a floating gate includes applying the potential for less than 20 microseconds. According to one embodiment, applying a potential of less than +3.0 Volts to the floating gate adds a charge of approximately 100 electrons on to the floating gate.

Another embodiment of the present invention includes a method for operating a non volatile depletion mode p-channel memory cell. The method includes writing a fixed charge on to a floating gate for the memory cell by applying an electric field of approximately +10 mega Volts/centimeter (MV/cm) across a floating gate oxide. The floating gate oxide is less than 30 Angstroms. The method includes erasing a fixed charge from the floating gate by applying an electric field of approximately −10 mega Volts/centimeter (MV/cm) across the floating gate oxide. The method further includes reading the non volatile depletion mode p-channel memory cell by grounding a control gate for the memory cell and driving the memory cell with a small drain voltage of less than −1.0 Volt.

Another embodiment of the present invention includes, a method for operating a non volatile depletion mode p-channel memory cell array having ultra thin tunnel gate oxides. The method includes writing a limited charge to the floating gate of a selected memory cell such that the floating gate retains a fixed charge when a control gate for the depletion mode p-channel memory cell is grounded. Writing a charge on to a floating gate for a selected memory cell further includes driving the source line of the selected cell negative, applying a positive potential to a control gate line connected to the selected memory cell and a number of other memory cells in the array, where the source lines for the number of other memory cells are grounded, such that an electric field of approximately +10 mega Volts/centimeter (MV/cm) is created across a tunnel gate oxide of the selected cell. The method includes erasing a charge from a whole row or word. Erasing a charge from a whole row or word further includes grounding a source line for the whole row or word and applying a negative potential to a control gate line connected to the whole row or word such that an electric field of approximately −10 mega Volts/centimeter (MV/cm) is created across the tunnel gate oxides of the whole row or word. The method further includes reading a depletion mode p-channel memory cell by grounding a control gate for the memory cell and driving the memory cell with a small drain voltage of less than −1.0 Volt. According to the teachings of the present invention, the writing and erasing in operating a non volatile depletion mode p-channel memory cell array having ultra thin tunnel gate oxides includes applying a potential of approximately +/−2.3 Volts across a tunnel gate oxide for less than 200 nanoseconds, wherein the tunnel gate oxide is approximately 23 Angstroms. Also, the writing and erasing in operating a non volatile depletion mode p-channel memory cell array having ultra thin tunnel gate oxides includes writing and erasing a charge of approximately 100 electrons on to floating gates in the non volatile depletion mode p-channel memory cell array.

Conclusion

Thus, structures and methods for non volatile depletion mode p-channel memory cells with ultra thin tunnel oxides, have been shown. Both the write and erase operations are performed by tunneling. The present invention operates on a static or DC basis and has stable DC output currents which can be sensed by current sense amplifiers and/or integrated over some period of time on a capacitor and sensed by differential voltage sense amplifiers. The sense operation can be relatively fast, in the nanosecond time frame, and as such could serve as a DRAM replacement.

The concept used here is based on the fact that for charge loss or gain from a floating gate by tunneling or thermally assisted tunneling to occur there must not only be a high density of initial states (as on the heavily doped floating gate) but also an allowed density of final states. By using PMOS "depletion" mode flash memory devices, even though the tunnel oxide might be ultrathin, e.g. 20–30 Å, there is a range potentials of floating gate for which there are no final nor initial states in the silicon substrate. In this range of potentials there can be no charge leakage, neither a gain nor a charge loss from the floating gate by tunneling or thermally assisted tunneling. In other words the potential of the floating gate can have different states and there will be no change in the charge state, due to leakage currents. The charge state of the floating gate will modulate the conductivity of the underlying transistor channel, with different stable and non-volatile charge states resulting in different conductivity states. This device is then a static and non-volatile memory cells with a least two different memory states possible.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method for forming a depletion mode p-channel memory cell, comprising:
    forming an oxide layer having a thickness of less than 50 Angstroms (Å) on a substrate having a p-type doped channel region separating a source and a drain region in the substrate;
    forming a floating gate on the oxide layer;
    forming a dielectric layer on the floating gate; and
    forming a control gate on the dielectric layer.

2. The method of claim 1, wherein forming the oxide layer includes forming the oxide layer to have a thickness of 23 Angstroms (Å).

3. The method of claim 1, wherein forming the floating gate includes forming a floating gate which has a bottom layer surface area of approximately $10^{-10}$ cm$^2$, and which is adapted to hold a fixed charge on the order of $10^{-17}$ Coulombs.

4. The method of claim 1, wherein forming the depletion mode p-channel memory cell includes forming a non volatile depletion mode p-channel memory cell, and wherein forming the floating gate includes forming a floating gate which is adapted to hold a fixed charge over a limited range of floating gate potentials.

5. The method of claim 1, wherein forming the floating gate includes forming an n+ type, heavily doped floating gate.

6. The method of claim 1, wherein forming the depletion mode p-channel memory cell includes forming the p-channel memory cell to operate at a voltage of approximately 1.0 Volts applied to the control gate.

7. A method for forming a depletion mode p-channel transistor, comprising:
    forming an oxide layer having a thickness of less than 50 Angstroms (Å) on a substrate having a p-type doped channel region separating a source and a drain region in the substrate; and
    forming a floating gate on the oxide layer, wherein the floating gate is adapted to hold a fixed charge over a limited range of floating gate potentials or electron energies.

8. The method of claim 7, wherein forming an oxide layer of less than 50 Angstroms (Å) includes forming the oxide layer to have a thickness of 23 Angstroms (Å).

9. The method of claim 7, wherein forming the floating gate further includes forming a floating gate which is adapted to hold a fixed charge on the order of $10^{-7}$ Coulombs over a range of floating gate potentials of +/−1.0 Volts.

10. The method of claim 7, wherein forming the depletion mode p-channel transistor further includes forming an intergate dielectric on the floating gate and forming a control gate on the intergate dielectric.

11. The method of claim 7, wherein forming the depletion mode p-channel transistor includes forming the depletion mode p-channel transistor to have an operating voltage of less than 2.5 Volts across the oxide layer.

12. A method of forming a memory device, comprising:
    forming a plurality of memory cells, wherein forming the plurality of memory cells includes forming at least one depletion mode p-channel memory cell, and wherein forming at least one depletion mode p-channel memory cell includes:
        forming an oxide layer having a thickness of less than 50 Angstroms (Å) on a substrate having a p-type doped channel region separating a source and a drain region in the substrate; and
        forming a floating gate on the oxide layer, and wherein forming the floating gate includes forming a floating gate which is adapted to hold a fixed charge over a range of floating gate potentials; and
    forming at least one sense amplifier, wherein forming at least one sense amplifier includes coupling the at least one amplifier to the plurality of memory cells.

13. The method of claim 12, wherein forming an oxide layer having a thickness of less than 50 Angstroms (Å) includes forming the oxide layer to have a thickness of 23 Angstroms (Å).

14. The method of claim 12, wherein forming the floating gate which is adapted to hold a fixed charge over a range of floating gate potentials includes forming a floating gate which is adapted to hold a fixed charge on the order of $10^{-17}$ Coulombs for a number of read operations on the order of $10^{-15}$ cycles.

15. The method of claim 12, wherein forming the at least one depletion mode p-channel transistor further includes forming an intergate dielectric on the floating gate and forming a control gate on the intergate dielectric.

16. The method of claim 15, wherein forming the at least one depletion mode p-channel transistor further includes forming the depletion mode p-channel transistor to have an operating voltage of approximately 1.0 Volt.

17. The method of claim 12, wherein forming the floating gate which is adapted to hold a fixed charge over a range of floating gate potentials includes forming a floating gate which is adapted to hold a fixed charge with an operating voltage of less than 2.5 Volts across the oxide layer.

18. A method for forming a non volatile depletion mode p-channel memory cell, comprising:

forming an oxide layer having a thickness of less than 50 Angstroms (Å) on a substrate having a p-type doped channel region separating a source and a drain region in the substrate;

forming an n+ type, heavily doped floating gate on the oxide layer;

forming a dielectric layer on the floating gate; and forming a control gate on the dielectric layer, wherein the memory cell is formed to hold a fixed charge on the floating gate over a limited range of floating gate potentials where electrons neither tunnel from nor tunnel to the floating gate.

19. The method of claim 18, wherein forming an oxide layer includes forming an oxide layer having a thickness of approximately 30 Angstroms (Å).

20. The method of claim 18, wherein forming an oxide layer includes forming an oxide layer having a thickness of approximately 23 Angstroms (Å).

21. The method of claim 18, wherein the fixed charge on the floating gate is on the order of $10^{-17}$ Coulombs.

22. A method for forming a non volatile depletion mode p-channel memory cell, comprising:

forming an oxide layer having a thickness of less than 50 Angstroms (Å) on a substrate having a p-type doped channel region separating a source and a drain region in the substrate;

forming an n+ type, heavily doped floating gate on the oxide layer where the floating gate has a bottom layer surface area of approximately $10^{-10}$ cm$^2$;

forming a dielectric layer on the floating gate; and forming a control gate on the dielectric layer, wherein the memory cell is formed to hold a fixed charge on the order of $10^{-17}$ Coulombs on the floating gate over a limited range of floating gate potentials where electrons neither tunnel from nor tunnel to the floating gate, and is formed to operate at a voltage of approximately 1.0 Volts applied to the control gate.

23. The method of claim 22, wherein forming an oxide layer includes forming an oxide layer having a thickness of approximately 30 Angstroms (Å).

24. The method of claim 22, wherein forming an oxide layer includes forming an oxide layer having a thickness of approximately 23 Angstroms (Å).

25. A method for forming a depletion mode p-channel memory cell, comprising:

forming an oxide layer having a thickness of less than 50 Angstroms (Å) on a substrate having a p-type doped channel region separating a source and a drain region in the substrate;

forming a floating gate on the oxide layer;

forming a dielectric layer on the floating gate; and forming a control gate on the dielectric layer, wherein the memory cell is formed to have a limited range of floating gate potentials where electrons neither tunnel from nor tunnel to the floating gate, the limited range of floating gate potentials including:

a first potential reached when electrons tunnel to the floating gate when a positive voltage is applied to the control gate, the first potential corresponding to a high conductivity state in the channel region; and a second potential reached when electrons tunnel from the floating gate when a negative voltage is applied to the control gate, the second potential corresponding to a low conductivity state in the channel region.

26. The method of claim 25, wherein forming an oxide layer includes forming an oxide layer having a thickness of approximately 30 Angstroms (Å).

27. The method of claim 25, wherein forming an oxide layer includes forming an oxide layer having a thickness of approximately 23 Angstroms (Å).

28. The method of claim 25, wherein forming the floating gate includes forming a floating gate which has a bottom layer surface area of approximately $10^{-10}$ cm$^2$, the memory cell being formed to hold a fixed charge on the order of $10^{-17}$ Coulombs on the floating gate and to operate at a voltage of approximately 1.0 Volts applied to the control gate.

29. A method for forming a depletion mode p-channel memory cell, comprising:

forming an oxide layer having a thickness of less than 50 Angstroms (Å) on a substrate having a p-type doped channel region separating a source and a drain region in the substrate;

forming a floating gate on the oxide layer;

forming a dielectric layer on the floating gate; and forming a control gate on the dielectric layer, wherein the memory cell is formed to have a limited range of floating gate potentials where electrons neither tunnel from nor tunnel to the floating gate, the limited range of floating gate potentials including:

a first potential reached when electrons tunnel to the floating gate when a positive voltage is applied to the control gate, the first potential corresponding to a high conductivity state in the channel region; and a second potential reached when electrons tunnel from the floating gate when a negative voltage is applied to the control gate, the second potential corresponding to a low conductivity state in the channel region, wherein the memory cell is formed to hold a fixed charge on the floating gate over a range of floating gate potentials includes forming a floating gate which is adapted to hold a fixed charge on the order of $10^{-17}$ Coulombs for a number of read operations on the order of $10^{15}$ cycles, and to have an operating voltage of approximately 1.0 Volt.

30. The method of claim 29, wherein forming an oxide layer includes forming an oxide layer having a thickness of approximately 30 Angstroms (Å).

31. The method of claim 29, wherein forming an oxide layer includes forming an oxide layer having a thickness of approximately 23 Angstroms (Å).

* * * * *

UNITED STATES PATENT AND TRADEMARK OFFICE
CERTIFICATE OF CORRECTION

PATENT NO.    : 6,864,139 B2
DATED         : March 8, 2005
INVENTOR(S)   : Forbes It is certified that error appears in the above-identified patent and that said Letters Patent is hereby corrected as shown below:

Title page,
Item [56], References Cited, OTHER PUBLICATIONS,
"Shi, Ying," reference, delete "Dialectrics" and insert -- Dielectrics --, therefor.
"Chau," reference, after "CMOS" delete "Tansistors" and insert -- Transistors --, therefor; and after "Electron" delete "." and insert -- , --, therefor.
"Tiwari," reference, delete "Solicon" and insert -- Silicon --, therefor.

Column 7,
Line 63, delete "$10^{-17}$" and insert -- $10^{-10}$ --, therefor.

Column 11,
Line 20, delete " $|IDS| = (\varepsilon C_o)(W/L)\dfrac{(VGS - VT)^2}{2}$ " and insert -- $|IDS| = (\varepsilon C_o)(W/L)\dfrac{(VGS - VT)^2}{2}$ --, therefor.

Column 16,
Line 59, delete "$10^{-15}$" and insert -- $10^{15}$ --, therefor.

Signed and Sealed this

Thirty-first Day of May, 2005

JON W. DUDAS
*Director of the United States Patent and Trademark Office*